(12) United States Patent
Sawatzky

(10) Patent No.: US 8,477,832 B2
(45) Date of Patent: Jul. 2, 2013

(54) LOAD INSENSITIVE QUADRATURE POWER AMPLIFIER POWER DETECTOR

(75) Inventor: David Sawatzky, Lisbon, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 54 days.

(21) Appl. No.: 12/970,996

(22) Filed: Dec. 17, 2010

(65) Prior Publication Data

US 2011/0176591 A1 Jul. 21, 2011

Related U.S. Application Data

(60) Provisional application No. 61/295,781, filed on Jan. 18, 2010.

(51) Int. Cl.
*H04B 17/00* (2006.01)
(52) U.S. Cl.
USPC .......... 375/224; 330/140; 330/124 R
(58) Field of Classification Search
USPC .......... 330/124 R, 295, 140, 84, 286
See application file for complete search history.

(56) References Cited

U.S. PATENT DOCUMENTS

| | | | | |
|---|---|---|---|---|
| 6,954,623 B2 * | 10/2005 | Chang et al. | ............... | 455/127.1 |
| 7,256,650 B1 * | 8/2007 | Stockert | ............... | 330/124 R |
| 8,005,445 B2 * | 8/2011 | Kuriyama et al. | ......... | 455/127.3 |
| 2002/0082792 A1 | 6/2002 | Bourde et al. | | |
| 2004/0196051 A1 | 10/2004 | Dunsmore et al. | | |
| 2006/0205375 A1 * | 9/2006 | Vaisanen | .................... | 455/276.1 |
| 2007/0035325 A1 | 2/2007 | Chao et al. | | |
| 2007/0052440 A1 | 3/2007 | Chao et al. | | |

FOREIGN PATENT DOCUMENTS

WO WO 2011/088433 9/2011

OTHER PUBLICATIONS

International Search Report and Written Opinion of the International Search Authority in PCT/US2011/021470 (WO 2011/088433), dated Sep. 22, 2011.

\* cited by examiner

*Primary Examiner* — Hieu Nguyen
(74) *Attorney, Agent, or Firm* — Knobbe Martens Olson & Bear, LLP

(57) ABSTRACT

A power detector includes a first phase shift element implemented to shift a phase of a first input signal to generate a first phase-shifted signal, a second phase shift element implemented to alter a phase of a second input signal to generate a second phase-shifted signal, a combiner for combining the first phase-shifted signal and the second phase-shifted signal to generate a combined single-phase signal, and a single element power detector for determining a power of the combined single-phase signal.

18 Claims, 7 Drawing Sheets

LOAD INSENSITIVE QUADRATURE POWER AMPLIFIER POWER DETECTOR

CROSS-REFERENCE TO RELATED APPLICATION

This application claims priority to and the benefit of the filing date of co-pending U.S. Provisional Patent Application No. 61/295,781, filed on Jan. 18, 2010, entitled "Load Insensitive Quadrature Power Amplifier Power Detector," the entire disclosure of which is hereby incorporated herein by reference.

BACKGROUND

Portable communication devices, such as cellular telephones, personal digital assistants (PDAs), WIFI transceivers, and other communication devices transmit and receive communication signals at various frequencies that correspond to different communication bands and at varying power levels. A power amplifier module, generally comprising one or more amplification stages, is used to transmit the communication signals. A radio frequency (RF) power amplifier system may include multiple amplification stages, and, in some applications, multiple amplification paths.

A quadrature power amplifier is one in which the power amplifier is divided into two "paths," a so-called "in-phase" (I) path and a so-called "quadrature" (Q) path. The in-phase path and the quadrature path are ideally separated in phase by 90 degrees. In one architecture, forward power detection in a quadrature power amplifier is performed by using a dual detector arrangement to sample the power in each of the in-phase and quadrature paths. The sampled power for each path is added together to obtain the total power. However, a dual detector arrangement exhibits accurate directionality at only 90 degree and 270 degree load phase angle, resulting in detector error at load phase angles other than 90 and 270 degrees. Further, this error worsens as voltage standing wave ratio (VSWR) increases.

FIG. 1 is a graphical diagram 10 illustrating an example of the output of a quadrature power amplifier with dual detectors. The dual detector architecture uses independent detectors on the in-phase (I) and quadrature (Q) paths whose average, or sum, represents the total power. In an implementation that uses bipolar junction transistor (BJT) technology to implement the amplification devices, the vertical axis 12 represents the output stage collector voltage of the in-phase path and the horizontal axis 14 represents the output stage collector voltage of the quadrature path. With a nominal output load, the in-phase path and quadrature paths are separated in phase by 90°.

The point 16 represents the voltage (i.e., the amplitude of the signal at the collector of the output stage) provided by the in-phase path and the point 18 represents the voltage (i.e., the amplitude of the signal at the collector of the output stage) provided by the quadrature path when the power amplifier has a nominal output load. However, in a real amplifier system having a VSWR at the output of the power amplifier, the point 16 rarely coincides exactly with the axis 12, and instead, is better represented as a circle 22 in which the point representing the amplitude of the signal at the collector of the output of the in-phase path can fall anywhere on the circumference of the circle 22 depending on the phase of the load. The radius of the circle 22 is proportional to the VSWR, with a higher VSWR corresponding to a larger circle. Similarly, the point 18 rarely coincides with the axis 14, and is better represented by a circle 24 in which the point representing the amplitude of the signal at the collector of the output of the quadrature path will fall on the circumference of the circle 24 at a location that is 180° opposite phase to the point representing the amplitude of the signal of the in-phase path. Using the quadrature path as an example, and equally applicable to the in-phase path, an arbitrary load phase at the output of the power amplifier is represented by vector 34 having an origin at point 18 and an angle 36 relative to a line 40 that is perpendicular to the axis 14 of the quadrature path. The magnitude of the vector 34 is determined by the VSWR at the output of the power amplifier.

The varying load phase angle 36 causes the point of the vector 28, which represents the detected RF voltage output of the quadrature path, to appear at a locus of locations on the circle 24 defined by the load phase angle 36. Similarly, a varying load phase angle will cause the vector 26 which represents the detected RF voltage output of the in-phase path, to appear at a locus of locations on the circle 22 defined by a load phase angle associated with a vector 42 having an origin at the point 16, and a load phase angle 44 relative to a line 48 that is perpendicular to the axis 12 of the in-phase path. Similar to the vector 34, the magnitude of the vector 42 is determined by the VSWR at the output of the power amplifier. The vector 42, relative to the line 48 that is perpendicular to the in-phase axis 12, is 180 out of phase from the vector 34, relative to the line 38 that is perpendicular to the quadrature axis 14. The load phase angle 36 is equal to the load phase angle 44, but the vectors 34 and 42 are 180 opposite in phase relative to the perpendicular lines 40 and 48, respectively. The vector 26 represents the detected RF voltage output of the in-phase path. The position of vector 26 on circle 22 is 180° out of phase from the position of vector 28 on circle 24. The above phase relationship is governed by the behavior of an ideal quadrature output matching network with load VSWR>1.

The time phase angle 32 represents the time phase of the vector 26 associated with the in-phase path and the time phase of the vector 28 (angle not shown) associated with the quadrature path relative to time. Accordingly, using the in-phase vector 26 as an example, but equally applicable to the quadrature vector 28, a peak error 38 in the detected RF voltage will exist because of the varying magnitude of the vector 26, which is determined by its location on the circle 22. Similarly, the varying magnitude of the vector 28 is determined by its location on the circle 24. This peak error 38 is a function of the load phase angle 44 for the in phase path and the load phase angle 36 for the quadrature path. Essentially this means that only at a load phase angle of 90° and at 270°, where the vectors 34 and 42 align with the axes 14 and 12, respectively, will the sum of the in-phase amplitude, represented by vector 26, and the quadrature amplitude, represented by vector 28 be an accurate representation of the power output.

FIG. 2 is a graphical illustration 50 showing power detector output voltage as a function of the load phase angle for a quadrature power amplifier with dual detectors. The dual detectors are independent detectors on the I and Q paths whose average or sum represents the total power. The horizontal axis 52 represents load phase angle and the vertical axis 54 represents detector output voltage. The traces 62, 64 and 66 represent the sum of the amplitude of the in-phase vector 26 and the quadrature vector 28 at VSWR 2:1; VSWR 4:1 and VSWR 6:1, respectively. As illustrated, it is clear that the detector output exhibits error at all load phases other than 90° and 270°; and furthermore, that the detector output error increases with increasing VSWR.

Thus, a dual detector arrangement will tend to indicate a power that is higher than the actual forward power resulting in an artificially lowered output power into a load having a VSWR greater than one, when used in a closed loop power control system.

SUMMARY

Embodiments of a power detector include a first phase shift element implemented to shift a phase of a first input signal to generate a first phase-shifted signal, a second phase shift element implemented to shift a phase of a second input signal to generate a second phase-shifted signal, a combiner for combining the first phase-shifted signal and the second phase-shifted signal to generate a combined single-phase signal, and a single element power detector for determining a power of the combined single-phase signal.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
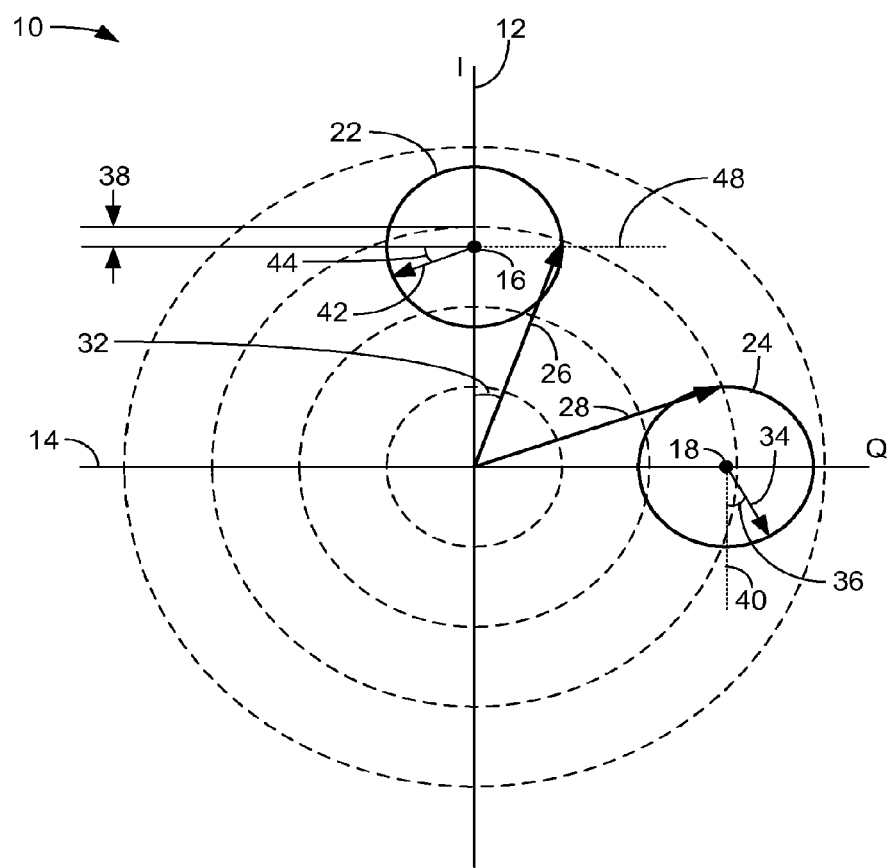
FIG. 1 is a graphical diagram illustrating an example of the output of a quadrature power amplifier with dual detectors.
Figure 2:
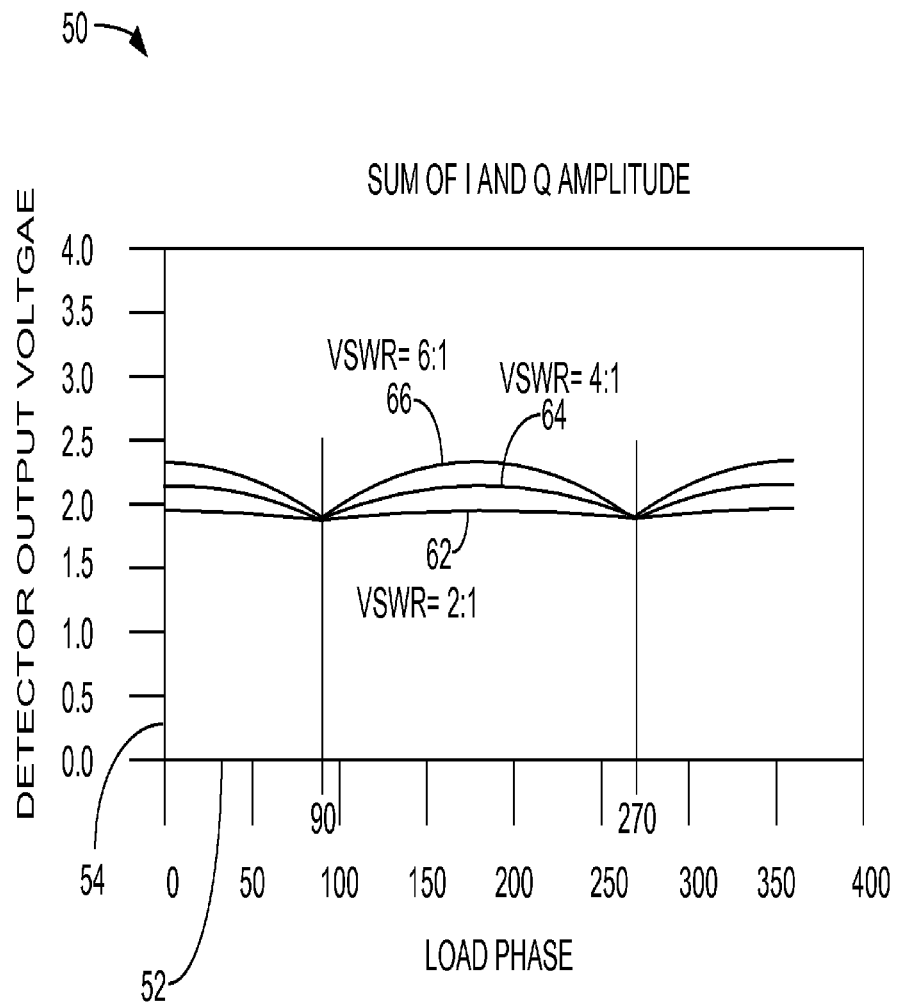
FIG. 2 is a graphical illustration showing power detector output voltage as a function of the load phase angle for a quadrature power amplifier with dual detectors.

Although described with particular reference to a portable communication device, such as a portable cellular telephone or a personal digital assistant (PDA), the load insensitive quadrature power amplifier power detector, which is also referred to as the load insensitive power detector, and the phase shift detector, can be used in any device or system that uses a quadrature power amplifier to amplify a transmit signal. The load insensitive quadrature power amplifier power detector can be implemented as part of an integrated module that contains other circuit elements, or can be implemented as a discrete power detector, or as a power detector in a discrete power amplification module.

The load insensitive quadrature power amplifier power detector can be implemented in hardware, software, or a combination of hardware and software. When implemented in hardware, the load insensitive quadrature power amplifier power detector can be implemented using specialized hardware elements and control logic. When the load insensitive quadrature power amplifier power detector is implemented partially in software, or implemented in a system that employs software control of various elements or components the software portion can be used to precisely control the various components of the load insensitive quadrature power amplifier power detector. The software can be stored in a memory and executed by a suitable instruction execution system (microprocessor). The hardware implementation of the load insensitive quadrature power amplifier power detector can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the load insensitive quadrature power amplifier power detector comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

Figure 3:
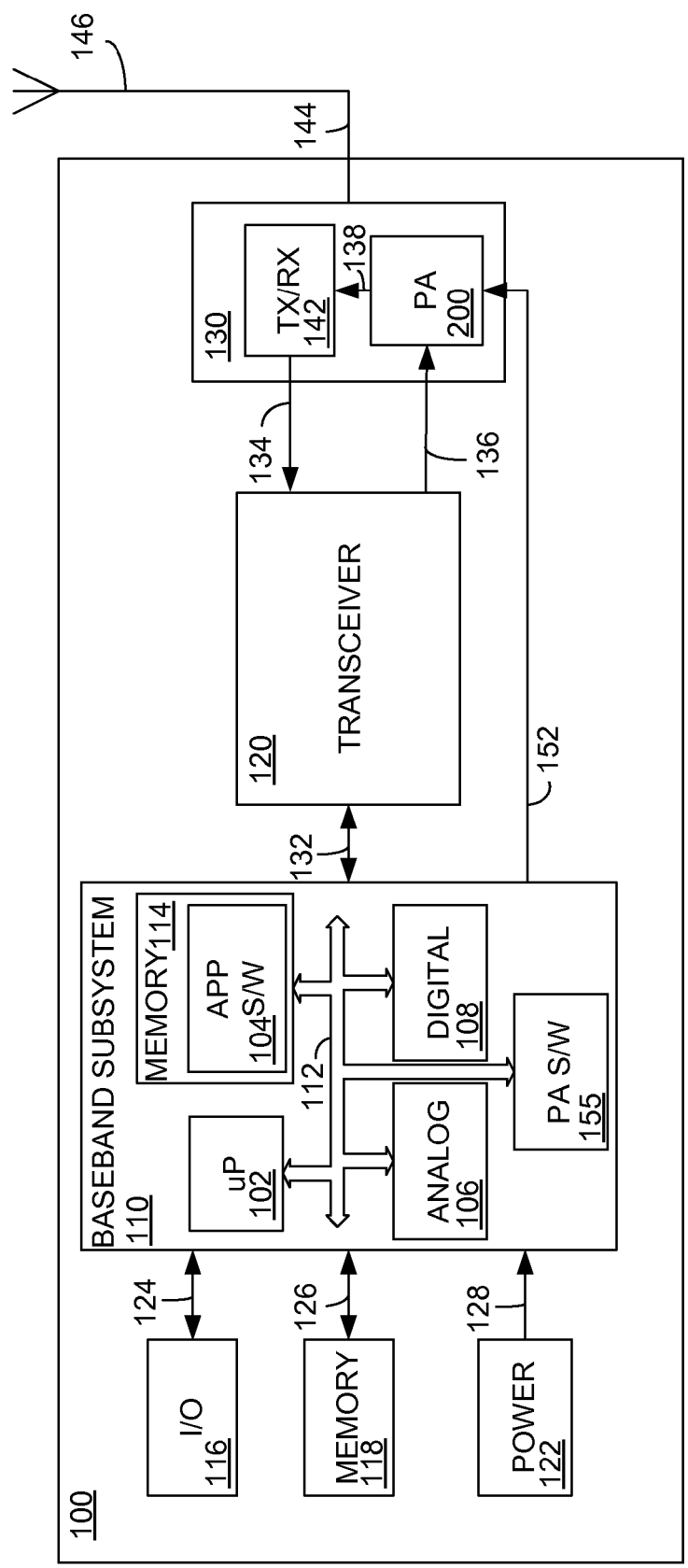
FIG. 3 is a block diagram illustrating a simplified portable communication device.

FIG. 3 is a block diagram illustrating a simplified portable communication device 100. In an embodiment, the portable communication device 100 can be a portable cellular telephone. Embodiments of the load insensitive quadrature power amplifier power detector can be implemented in any device having an RF transmitter and quadrature power amplifier, and in this example, are implemented in a portable communication device 100. The portable communication device 100 illustrated in FIG. 3 is intended to be a simplified example of a cellular telephone and to illustrate one of many possible applications in which the load insensitive quadrature power amplifier power detector can be implemented. One having ordinary skill in the art will understand the operation of a portable cellular telephone, and, as such, implementation details are omitted. The portable communication device 100 includes a baseband subsystem 110, a transceiver 120, and a front end module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108 and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other devices or system that allow a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the load insensitive quadrature power amplifier power detector are implemented in software, then the baseband subsystem 110 also includes power amplifier software 155, which may cooperate with control logic that can be executed by the microprocessor 102, or by another processor, to control the operation of the power amplifier 200 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 200. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 200. As will be described in detail below, the power amplifier 200 can be implemented with a load insensitive quadrature power amplifier power detector. The output of the power amplifier 200 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120.

In an embodiment, the baseband subsystem 110 provides a power, or mode selection, signal over connection 152 to the power amplifier 200. The mode selection signal determines whether one or more amplification paths within the power amplifier 200 are enabled.

Figure 4:
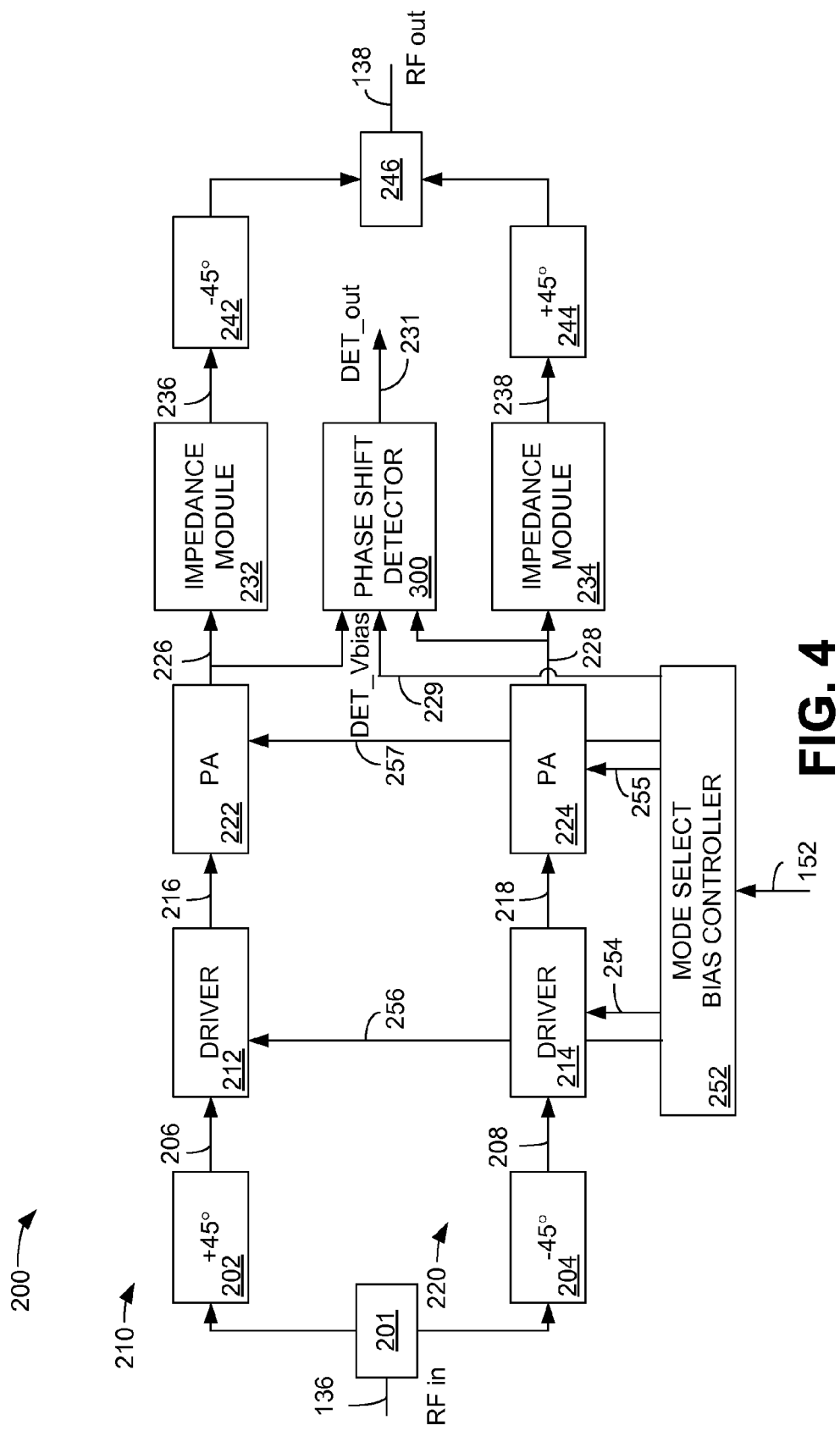
FIG. 4 is a simplified block diagram illustrating an embodiment of the power amplifier of FIG. 3.

FIG. 4 is a simplified block diagram illustrating an embodiment of the power amplifier 200 of FIG. 3. The power amplifier 200 is shown as implemented using two amplification paths. The power amplifier 200 includes a first amplification path 210 and a second amplification path 220. Two amplification paths are shown for example only. Other embodiments having more than two amplification paths, are possible. A radio frequency (RF) input signal is provided over connection 136 to a splitter 201. The splitter 201 provides the RF input signal to the first amplification path 210 and to the second amplification path 220.

Each amplification path includes a respective phase shift element. The first amplification path 210 includes a phase shift element 202 and the second amplification path 220 includes a phase shift element 204. In an embodiment, the phase shift element 202 provides a +45° phase shift and the phase shift element 204 provides a −45° phase shift. In such an embodiment, the first amplification path 210 is 90° separated in phase with respect to the second amplification path 220. However, other phase shift relationships may be established between the amplification path 210 and the amplification path 220, depending on the application.

The output of the phase shift element 202 is provided over connection 206 to a driver circuit 212, and the output of the phase shift element 204 is provided over connection 208 to a driver circuit 214. The driver circuit 212 and the driver circuit 214 can be implemented using a variety of transistor technologies including, for example but not limited to, bipolar junction (BJT) technology, heterojunction bipolar transistor (HBT) technology, metal-oxide semiconductor field effect transistor (MOSFET) technology, complementary metal oxide semiconductor (CMOS) technology, or any other transistor technology.

The output of the driver circuit 212 is provided over connection 216 to power amplifier 222, and the output of the driver circuit 214 is provided over connection 218 to the power amplifier 224. The power amplifier 222 and the power amplifier 224 may include one or more power amplifier stages, and are illustrated in FIG. 4 as single elements for simplicity only. The power amplifier 222 and the power amplifier 224 can be implemented using a variety of technologies including, for example but not limited to, bipolar junction (BJT) technology, heterojunction bipolar transistor (HBT) technology, metal-oxide semiconductor field effect transistor (MOSFET) technology, complementary metal oxide semiconductor (CMOS) technology, or any other transistor technology.

In an embodiment, a mode select and bias control element 252, under the control of the baseband subsystem 110, controls and biases the driver circuits 212 and 214 and the power amplifiers 222 and 224.

The output of the power amplifier 222 is provided over connection 226 to an impedance module 232, and the output of the power amplifier 224 is provided over connection 228 to an impedance module 234. The impedance module 232 and the impedance module 234 are sometimes referred to as "matching elements," "output matching elements," or "output impedance modification elements" because they transform the impedance on connections 226 and 228 respectively. The impedance module 232 and the impedance module 234 modify the impedance at their input connections 226 and 228, respectively, to match varying impedance on connections 236 and 238, caused by, for example, varying load conditions at the output of the amplifier on connection 138.

The output of the power amplifier 222 is also provided over connection 226 to a phase shift detector 300. Similarly, the output of the power amplifier 224 is provided over connection 228 to the phase shift detector 300. A detector bias signal, DET_Vbias, is provided to the phase shift detector 300 over connection 229 from the mode select and bias controller 252. As will be described in greater detail below, the phase shift detector 300 determines the power output of the power amplifier 222 and the power amplifier 224 and provides a detector signal, DET_out, over connection 231 which is related to the square root of the forward power of the power amplifier. The detector output on connection 231 can be provided to a buffer amplifier (not shown for simplicity) or other detector signal processing elements.

The output of the impedance module 232 is provided over connection 236 to phase shift element 242, and the output of impedance module 234 is provided over connection 238 to phase shift element 244. In this example, the phase shift element 242 provides a −45° phase shift, which is complementary to the phase shift provided by phase shift element 202; and the phase shift element 244 provides a +45° phase shift, which is complementary to the phase shift provided by phase shift element 204. The output of the phase shift element 242 and the output of the phase shift element 244 are combined in combiner 246 and provided over connection 138 and provide the output of the power amplifier 200. The phase of the RF signal at connection 138 is a delayed version of the RF signal at connection 136.

In accordance with an embodiment of the load insensitive power detector, the phase shift detector 300 includes circuitry that shifts the phase of the signals on connection 226 and 228 so that a single power detector can be used to determine the power provided by amplification paths 210 and 220, thus minimizing error caused by a varying load phase.

Figure 5:
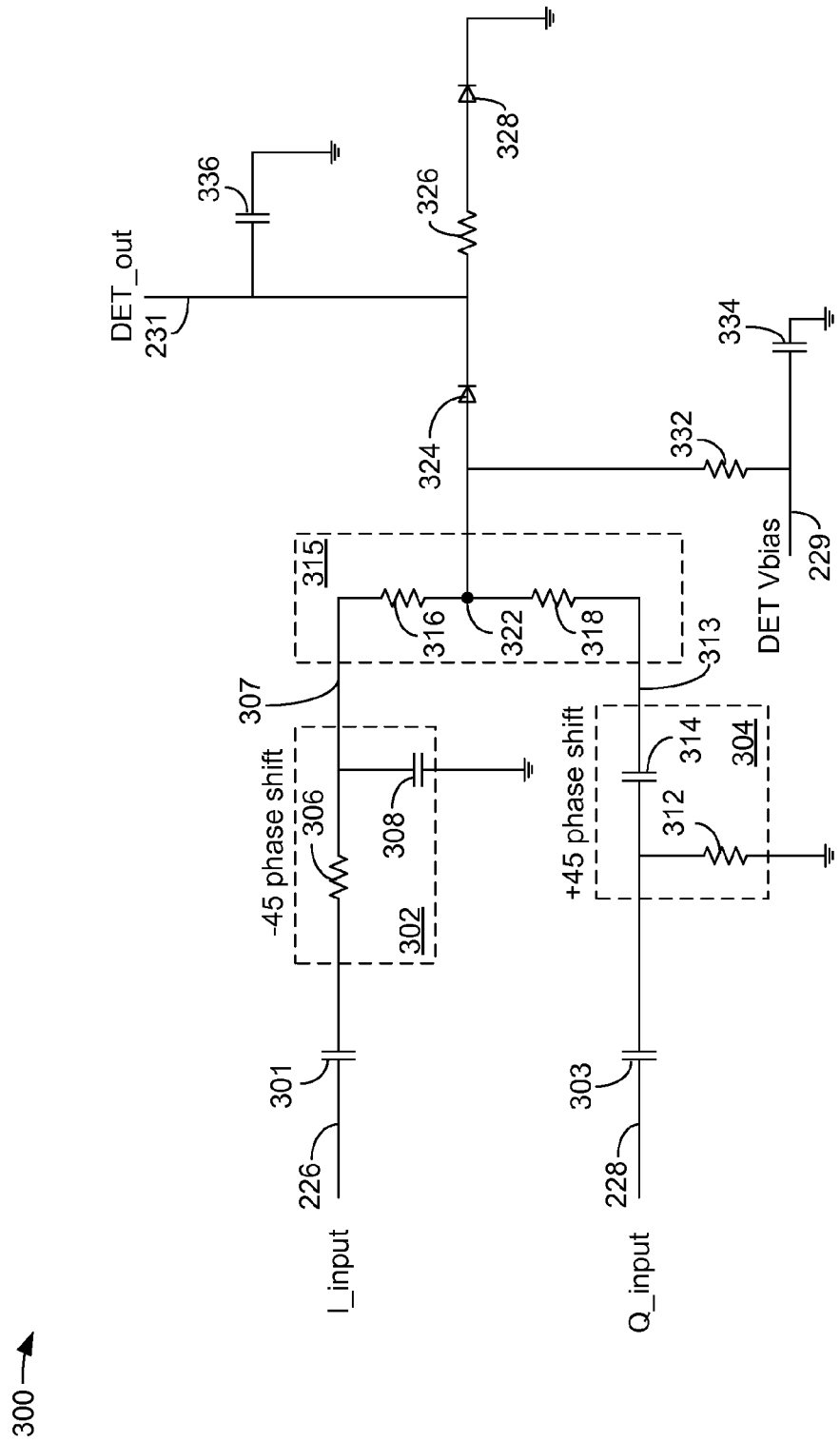
FIG. 5 is a schematic diagram illustrating an embodiment of the phase shift detector of FIG. 4.

FIG. 5 is a schematic diagram illustrating an embodiment of the phase shift detector 300 of FIG. 4. The phase shift detector 300 comprises a phase shift element 302, which provides a −45° phase shift and a phase shift element 304, which provides a +45° phase shift. The phase shift element 302 receives the in-phase signal from the power amplifier 222 (FIG. 4) over connection 226 across a dc blocking capacitor 301. The phase shift element 304 receives the quadrature signal from the power amplifier 224 (FIG. 4) over connection 228 across a dc blocking capacitor 303.

The −45° phase shift element 302 comprises, in an embodiment, a resistor 306 and a capacitor 308. The +45° phase shift element 304 comprises a resistor 312 and a capacitor 314. Alternative embodiments of the phase shift elements 302 and 304 may implement combinations of resistive, capacitive and inductive elements to achieve the desired phase shift. Further, phase shift values other than +45 degrees and −45 degrees are possible, so long as the phase difference is a nominal 90 degrees. For example, values other than +/−45 degrees may be desirable in order to minimize or balance the insertion losses of the two phase shifters. The description provided herein uses +/−45 degrees for simplicity of illustration and because it is consistent with the +/−45 degrees phase separation used in the quadrature amplifier.

The phase shifted output of the −45° phase shift element 302 and the phase shifted output of the +45° phase shift element 304 are provided over respective connections 307 and 313 to a combiner 315. A phase of the first phase-shifted signal on connection 307 aligns with a phase of the second phase-shifted signal on connection 313. The combiner 315, in this embodiment, is illustrated as a resistive combiner comprising resistors 316 and 318, which combine the signals on connections 307 and 313. However, other RF combiner architectures may be implemented. The output of the combiner 315 is a single-phase signal provided at node 322 and which is provided to a detector diode 324. In this embodiment, a single detector diode 324 receives the combined, phase shifted in-phase and quadrature signals, which are phase shifted so that they are coincident in phase. In this manner, a single phase combined power signal appears at the node 322 and at the input to the detector diode 324. Alternatively, other detector architectures, such as a log detector may be implemented so long as the detector has a high input impedance of, for example, >1000 ohms.

A bias voltage, DET_Vbias, is used to forward bias the detector diode 324 and a temperature compensating diode 328, and is provided over connection 229 from the mode select and bias controller 252 of FIG. 4 through a resistance 332 to the input of the detector diode 324. The output of the detector diode 324 represents the power of the signal on connection 322 and is provided over connection 231. A capacitor 336 decouples the output of the detector diode 324 on connection 231. Similarly a capacitor 334 decouples the bias signal on connection 229, providing an RF ground at that point.

The temperature compensating diode 328 is coupled to the output of the detector diode 324 through a resistor 326. While being an optional element, the temperature compensating diode 328 compensates for temperature induced variances in the output of the detector diode 324, as known in the art. Although the phase shift detector 300 is described in FIG. 5 with exemplary resistive and capacitive elements, the functional blocks of the phase shift detector 300 shown in FIG. 5 can be implemented using any components that provide the same functional result described herein. For example, the phase shift element 302, phase shift element 304, combiner 315, and detector 324 can be implemented using different elements than that shown and still achieve the result described herein.

Figure 6:
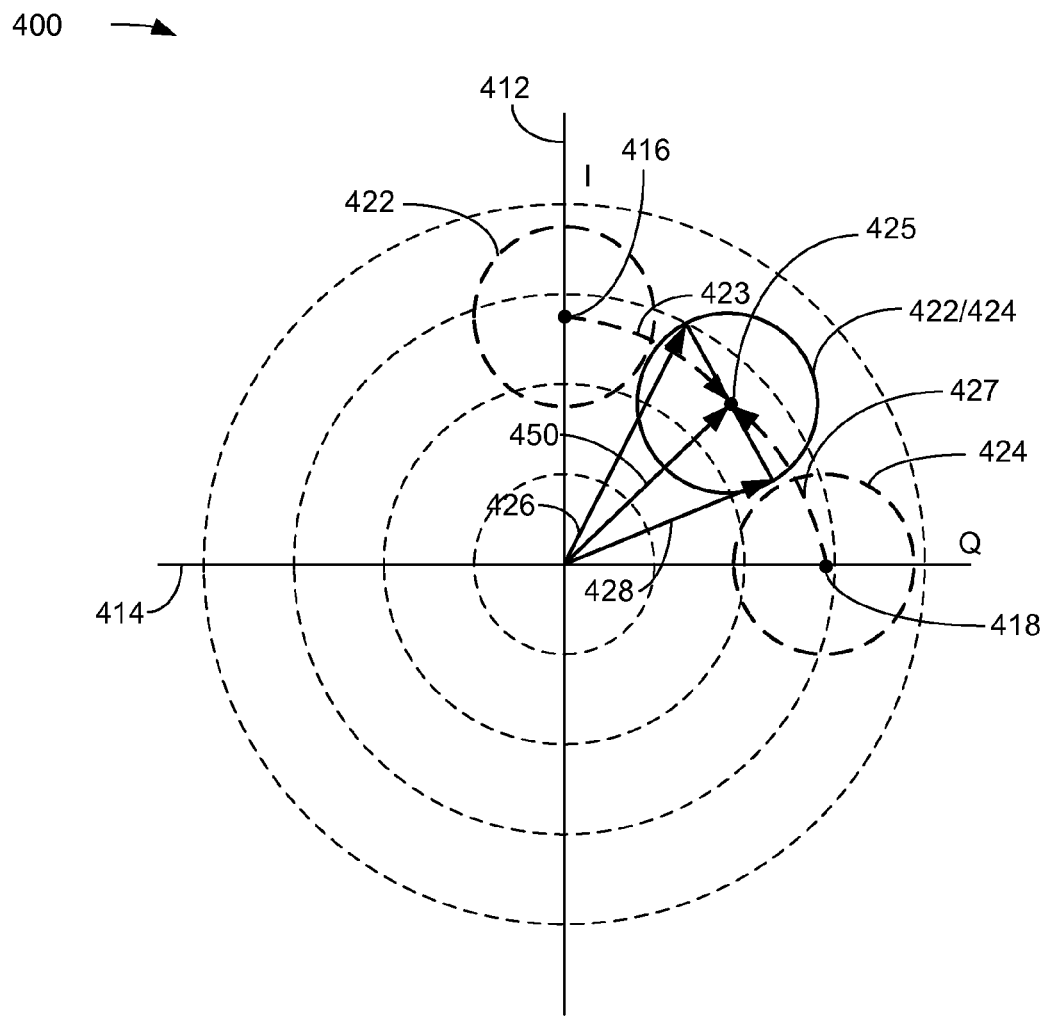
FIG. 6 is a graphical illustration graphically showing the operation of an embodiment of the phase shift detector of FIG. 5.

FIG. 6 is a graphical illustration 400 graphically showing the operation of an embodiment of the phase shift detector 300 of FIG. 5. The vertical axis 412 represents the output stage collector voltage for the in-phase path and the horizontal axis 414 represents the output stage collector voltage for the quadrature path.

The −45° phase shift element 302 and the +45° phase shift element 304 cause the circle 422, which represents an example of a real in-phase RF voltage output, to shift 45°, as represented by arrow 423 and causes the circle 424 to shift 45° in the opposite direction as represented by arrow 427 so that the circle 422 is coincident with the circle 424 at a nominal 45 degree position relative to the axis 414, which represents a real quadrature RF voltage output. As shown in FIG. 6, the circle 422 representing the in-phase RF voltage and the circle 424 representing the quadrature RF voltage now overlap and occupy the same space on the diagram 400.

After shifting the vectors 426 and 428, the in-phase voltage, represented by the vector 426; and the quadrature voltage, represented by the vector 428 are now 180° apart on the same (the two coincident circles) circle 422/424. Accordingly, to determine the power provided by the power amplifier 200, the vectors 426 and 428 are averaged in the combiner 315 (FIG. 4). The resultant vector 450 represents the averaged combination of the vector 426 and the vector 428 and will always result in a point 425 at the center of the circle 422/424 representing the combined power output. The point 425 will always appear in the center of the circle 422/424, regardless of the load phase angle or the diameter of the circle. In this manner, the single detector diode 324 (FIG. 5) can determine the forward power without regard to load phase angle, peak offset error or VSWR.

Figure 7:
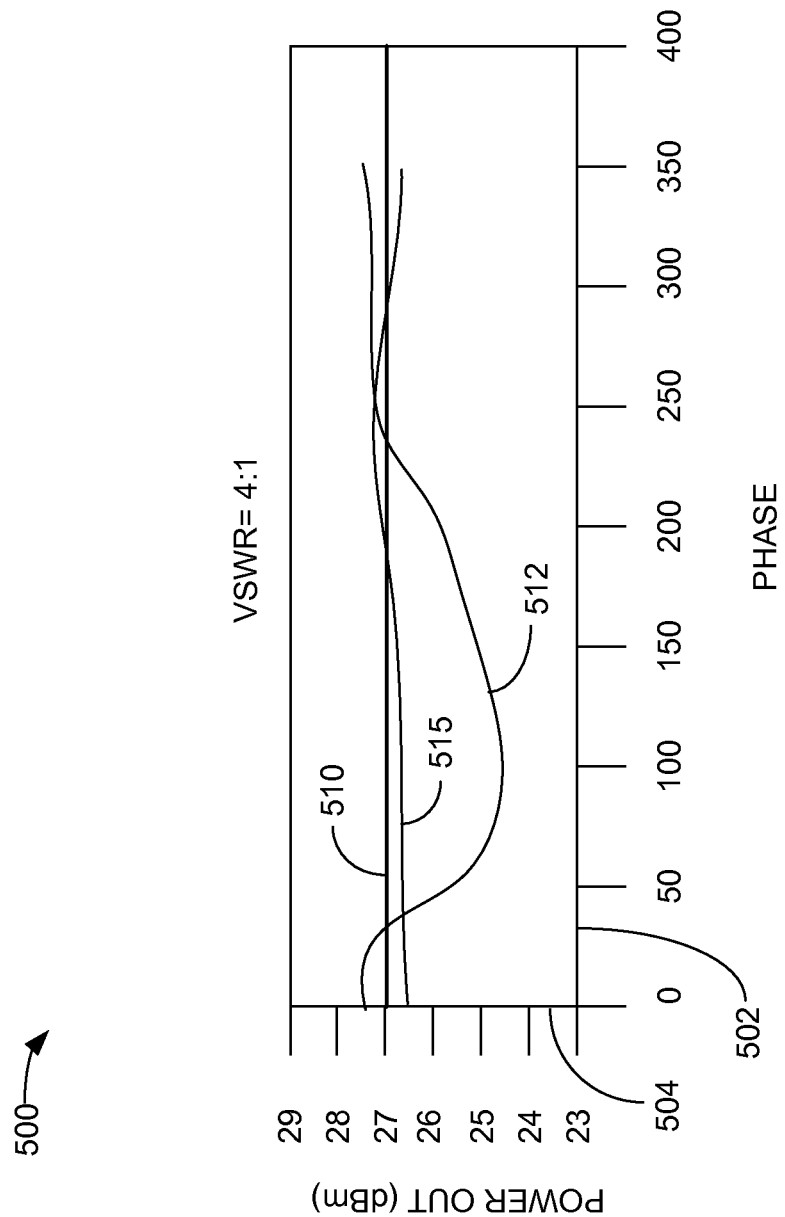
FIG. 7 is a graphical illustration showing the relationship between the power output of a power amplifier and the time phase angle.

FIG. 7 is a graphical illustration showing the relationship between the power output of a power amplifier and the time phase angle. The horizontal axis 502 represents time phase angle and the vertical axis 504 represents power amplifier power output in dBm. The trace of 510 represents a desired power output of 27 dBm. The trace 512 represents amplifier power output when output power is detected by a prior art dual power detector. As shown, there is a relatively large error between actual power represented by trace 512 and desired power represented by trace 510. The trace 515 represents the output of the power amplifier when output power is detected by the phase shift power detector 300 of FIG. 4. As illustrated, the power output illustrated by trace 515 tracks the desired power output 510 significantly closer than does the power output represented by trace 512.

While various embodiments of the invention have been described, it will be apparent to those of ordinary skill in the art that many more embodiments and implementations are possible that are within the scope of the invention. For example, the invention is not limited to a specific type of communication device or transceiver. Embodiments of the invention are applicable to different types of communication devices and transceivers.

What is claimed is:

1. A power detector comprising:
a first phase shift element implemented to shift a phase of a first radio frequency (RF) input signal to generate a first phase-shifted signal, the first RF input signal being an output of a final amplification stage of a first set of power amplifier stages including at least an initial amplification stage and the final amplification stage;
a second phase shift element implemented to shift a phase of a second RF input signal to generate a second phase-shifted signal, the second RF input signal being an output of a final amplification stage of a second set of power amplifier stages including at least an initial amplification stage and the final amplification stage;
a resistive combiner for combining the first phase-shifted signal and the second phase-shifted signal to generate a combined single-phase signal; and
a single element power detector for determining a power of the combined single-phase signal.

2. The power detector of claim 1 wherein the first phase shift element and the second phase shift element shift phase so that a phase of the first phase-shifted signal is coincident with a phase of the second phase-shifted signal.

3. The power detector of claim 1 wherein the single element power detector is a diode.

4. The power detector of claim 1 wherein the first RF input signal is an in-phase signal and the second RF input signal is a quadrature signal.

5. The power detector of claim 1 wherein the power of the combined single-phase signal is an average of a power of the first RF input signal and a power of the second RF input signal, the power of the combined single-phase signal being independent of a load phase angle and voltage standing wave ratio (VSWR) of the first RF input signal and the second RF input signal.

6. The power detector of claim 1 wherein the first phase shift element imparts a +45 degree phase shift and the second phase shift element imparts a −45 degree phase shift.

7. A power amplifier comprising:
a first amplification path including an initial amplification stage and a final amplification stage of a first set of power amplifier stages configured to provide a first amplified radio frequency (RF) signal at an output of the final amplification stage of the first set of power amplifier stages;
a second amplification path including an initial amplification stage and a final amplification stage of a second set of power amplifier stages configured to provide a second amplified RF signal at an output of the final amplification stage of the second set of power amplifier stages; and
a power detector including a first phase shift element implemented to shift a phase of the first amplified RF signal resulting in a first phase-shifted signal, a second phase shift element implemented to shift a phase of the second amplified RF signal resulting in a second phase-shifted signal, a resistive combiner for combining the first phase-shifted signal and the second phase-shifted signal to generate a combined single-phase signal, and a single element power detector for determining a power of the combined single-phase signal.

8. The power amplifier of claim 7 wherein the first phase shift element and the second phase shift element shift phase so that a phase of the first phase-shifted signal is coincident with a phase of the second phase-shifted signal.

9. The power amplifier of claim 7 wherein the single element power detector is a diode.

10. The power amplifier of claim 7 wherein the first amplified RF signal is an in-phase signal and the second amplified RF signal is a quadrature signal.

11. The power amplifier of claim 10 wherein the power of the combined single-phase signal includes an average of a power of the in-phase signal and a power of the quadrature signal, the power of the combined single-phase signal being independent of a load phase angle and voltage standing wave ratio (VSWR) of the in-phase signal and the quadrature signal.

12. The power amplifier of claim 7 wherein the first phase shift element imparts a +45 degree phase shift and the second phase shift element imparts a −45 degree phase shift.

13. A method for power detection comprising:
providing a radio frequency (RF) output signal of a final amplification stage of a first set of power amplifier stages to a first phase shift element implemented to shift a phase of the RF output signal of the final amplification stage of the first set of power amplifier stages to generate a first phase-shifted signal, the first set of power amplifier stages including at least an initial amplification stage and the final amplification stage;
providing an RF output signal of a final amplification stage of a second set of power amplifier stages to a second phase shift element implemented to shift a phase of the RF output signal of the final amplification stage of the second set of power amplifier stages to generate a second phase-shifted signal, the second set of power amplifier stages including at least an initial amplification stage and the final amplification stage;

resistively combining the first phase-shifted signal and the second phase-shifted signal to generate a combined single-phase signal; and determining a power of the combined single-phase signal using a single element power detector.

14. The method of claim 13 further comprising:

shifting the phase of the RF output signal of the final amplification stage of the first set of power amplifier stages; and shifting the phase of the RF output signal of the final amplification stage of the second set of power amplifier stages, the phase of the first phase-shifted signal being coincident with the phase of the second phase-shifted signal.

15. The method of claim 13 wherein the single element power detector has an input impedance of greater than approximately 1,000 ohms.

16. The method of claim 13 wherein the RF output signal of the final amplification stage of the first set of power amplifier stages is an in-phase voltage and the RF output signal of the final amplification stage of the second set of power amplifier stages is a quadrature voltage.

17. The method of claim 16 wherein determining the power of the combined single-phase signal includes averaging a power of the in-phase voltage and a power of the quadrature voltage, the power of the combined single-phase signal being independent of a load phase angle and voltage standing wave ratio (VSWR) of the in-phase voltage and the quadrature voltage.

18. The method of claim 14 wherein shifting the phase of the RF output signal of the final amplification stage of the first set of power amplifier stages imparts a +45 degree phase shift and shifting the phase of the RF output signal of the final amplification stage of the second set of power amplifier stages imparts a −45 degree phase shift.

* * * * *